United States Patent
Iwasaki et al.

(10) Patent No.: US 10,879,141 B2
(45) Date of Patent: Dec. 29, 2020

(54) INSULATED HEAT DISSIPATION SUBSTRATE

(71) Applicant: NGK INSULATORS, LTD., Nagoya (JP)

(72) Inventors: Shingo Iwasaki, Nagoya (JP); Takashi Ebigase, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/542,466

(22) Filed: Aug. 16, 2019

(65) Prior Publication Data
US 2019/0371690 A1 Dec. 5, 2019

Related U.S. Application Data

(63) Continuation of application No. PCT/JP2018/001257, filed on Jan. 17, 2018.

(30) Foreign Application Priority Data

Feb. 23, 2017 (WO) .................. PCT/JP2017/006948

(51) Int. Cl.
*H01L 23/15* (2006.01)
*H01L 23/13* (2006.01)
(Continued)

(52) U.S. Cl.
CPC .............. *H01L 23/15* (2013.01); *H01L 23/13* (2013.01); *H01L 23/40* (2013.01); *H01L 24/32* (2013.01);
(Continued)

(58) Field of Classification Search
CPC ......... H01L 23/15; H01L 23/13; H01L 23/40; H01L 24/32; H01L 24/83; H01L 2224/32225; H01L 2224/83385
(Continued)

(56) References Cited

U.S. PATENT DOCUMENTS

| 5,328,751 | A | 7/1994 | Komorita et al. |
| 2002/0060091 | A1 | 5/2002 | Naba et al. |

(Continued)

FOREIGN PATENT DOCUMENTS

| JP | H05-152461 A1 | 6/1993 |
| JP | H11-233903 A1 | 8/1999 |

(Continued)

OTHER PUBLICATIONS

English translation of International Preliminary Report on Patentability (Chapter I) (Application No. PCT/JP2018/001257) dated Sep. 6, 2019, 6 pages.

(Continued)

*Primary Examiner* — Sheikh Maruf
(74) *Attorney, Agent, or Firm* — Burr & Brown, PLLC

(57) ABSTRACT

An insulated heat dissipation substrate including: a ceramic substrate; and a conductor layer bonded onto at least one of main surfaces of the ceramic substrate, wherein the conductor layer includes: an upper surface; a lower surface; and a side surface 1 connecting the upper surface with the lower surface; the ceramic substrate includes: a lowest portion; a side surface 2 connecting the lowest portion with the side surface 1 of the conductor layer; and a bonding surface at a position higher than the lowest portion, the bonding surface being bonded to the lower surface of the conductor layer; an absolute value ($|\alpha-\beta|$) is 20° or less on average; and the side surface 1 has a receding portion from an end of the upper surface in the normal direction relative to the tangential line of the contour of the conductor layer as viewed in plane.

7 Claims, 5 Drawing Sheets

(51) Int. Cl.
- H01L 23/40 (2006.01)
- H01L 23/00 (2006.01)
- H05K 1/02 (2006.01)
- H05K 1/03 (2006.01)
- H05K 3/38 (2006.01)

(52) U.S. Cl.
CPC ........... H01L 24/83 (2013.01); H05K 1/0209 (2013.01); H05K 1/0306 (2013.01); H05K 3/381 (2013.01); *H01L 2224/32225* (2013.01); *H01L 2224/83385* (2013.01)

(58) Field of Classification Search
USPC ........................................................ 257/703
See application file for complete search history.

(56) References Cited

U.S. PATENT DOCUMENTS

| | | | | |
|---|---|---|---|---|
| 2014/0138850 | A1* | 5/2014 | Takayama | H01L 24/29 257/774 |
| 2014/0217608 | A1* | 8/2014 | Takayama | H01L 23/4006 257/774 |
| 2015/0060930 | A1* | 3/2015 | Sasaki | H01L 33/641 257/99 |
| 2015/0255419 | A1* | 9/2015 | Nishimoto | H01L 23/49822 257/773 |
| 2015/0257252 | A1* | 9/2015 | Kato | H01L 24/83 257/773 |
| 2016/0035683 | A1* | 2/2016 | Saito | H01L 24/45 257/77 |
| 2016/0163617 | A1* | 6/2016 | Tani | H01L 23/49894 361/783 |
| 2017/0062305 | A1* | 3/2017 | Terasaki | B23K 35/302 |
| 2017/0317008 | A1* | 11/2017 | Momose | H01L 21/4853 |
| 2017/0323842 | A1* | 11/2017 | Tani | H01L 21/4846 |
| 2018/0108593 | A1* | 4/2018 | Terasaki | C22C 21/04 |
| 2018/0182716 | A1* | 6/2018 | Miyazaki | H01L 23/562 |
| 2018/0190568 | A1* | 7/2018 | Naba | H01L 23/49811 |

FOREIGN PATENT DOCUMENTS

| | | | |
|---|---|---|---|
| JP | 2003-163384 | A1 | 6/2003 |
| JP | 2003163384 | A * | 6/2003 |
| JP | 2005-116602 | A1 | 4/2005 |
| JP | 2007-109995 | A1 | 4/2007 |
| JP | 4051164 | B2 | 2/2008 |
| JP | 4688380 | B2 | 5/2011 |
| JP | 5038565 | B2 | 10/2012 |
| JP | 5498839 | B2 | 5/2014 |

OTHER PUBLICATIONS

International Search Report and Written Opinion (Application No. PCT/JP2018/001257) dated Mar. 13, 2018.

* cited by examiner

[FIG. 1]
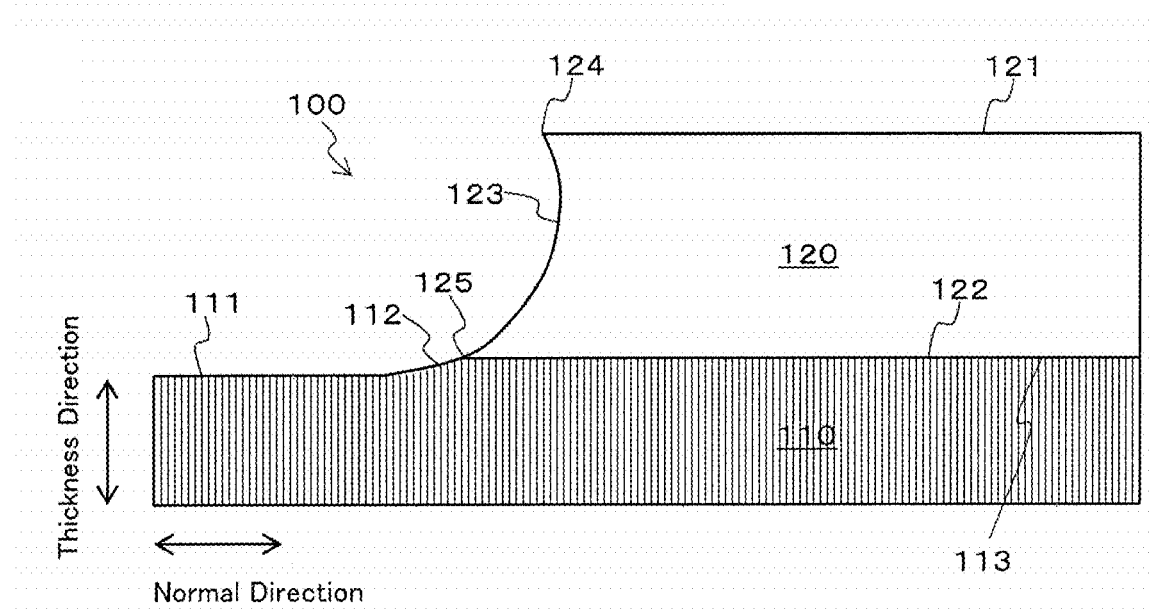

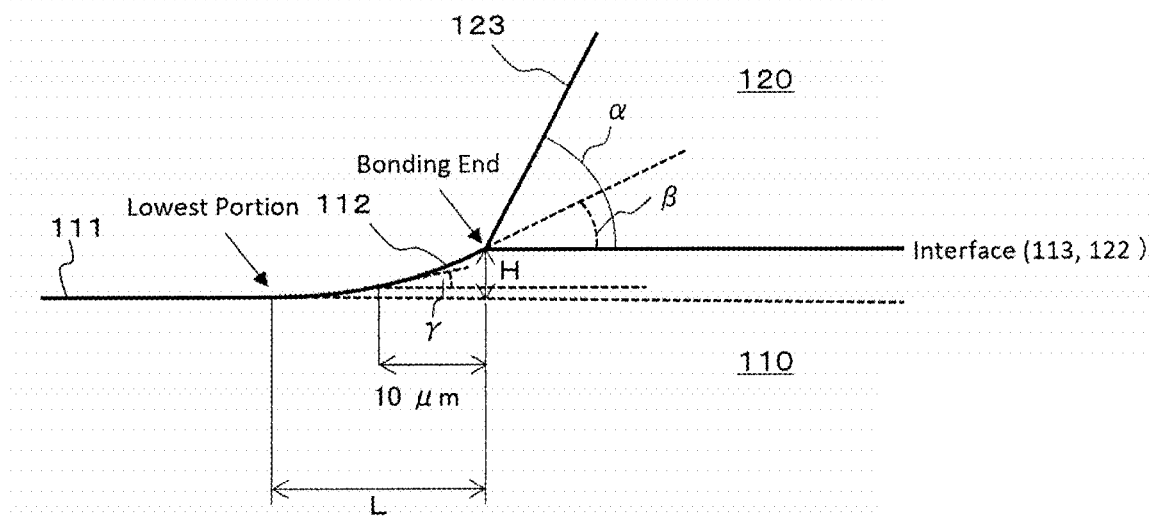

[FIG. 3]
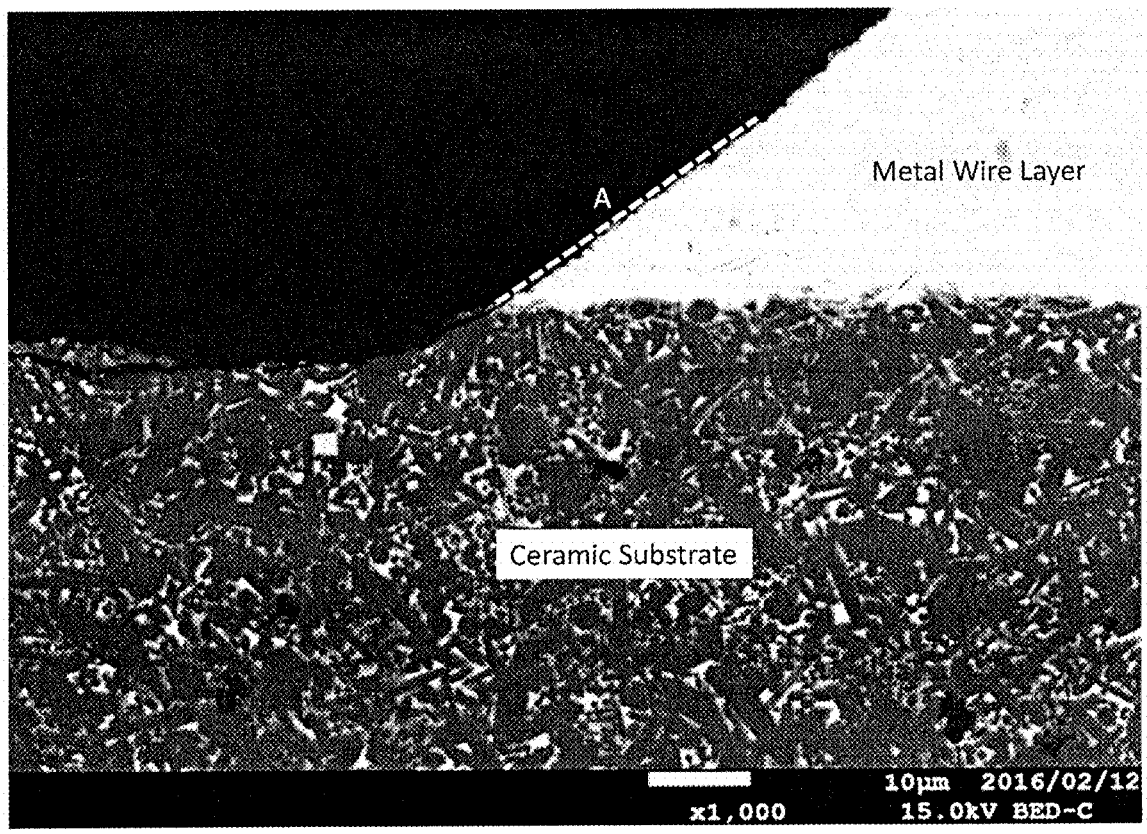

[FIG. 4]
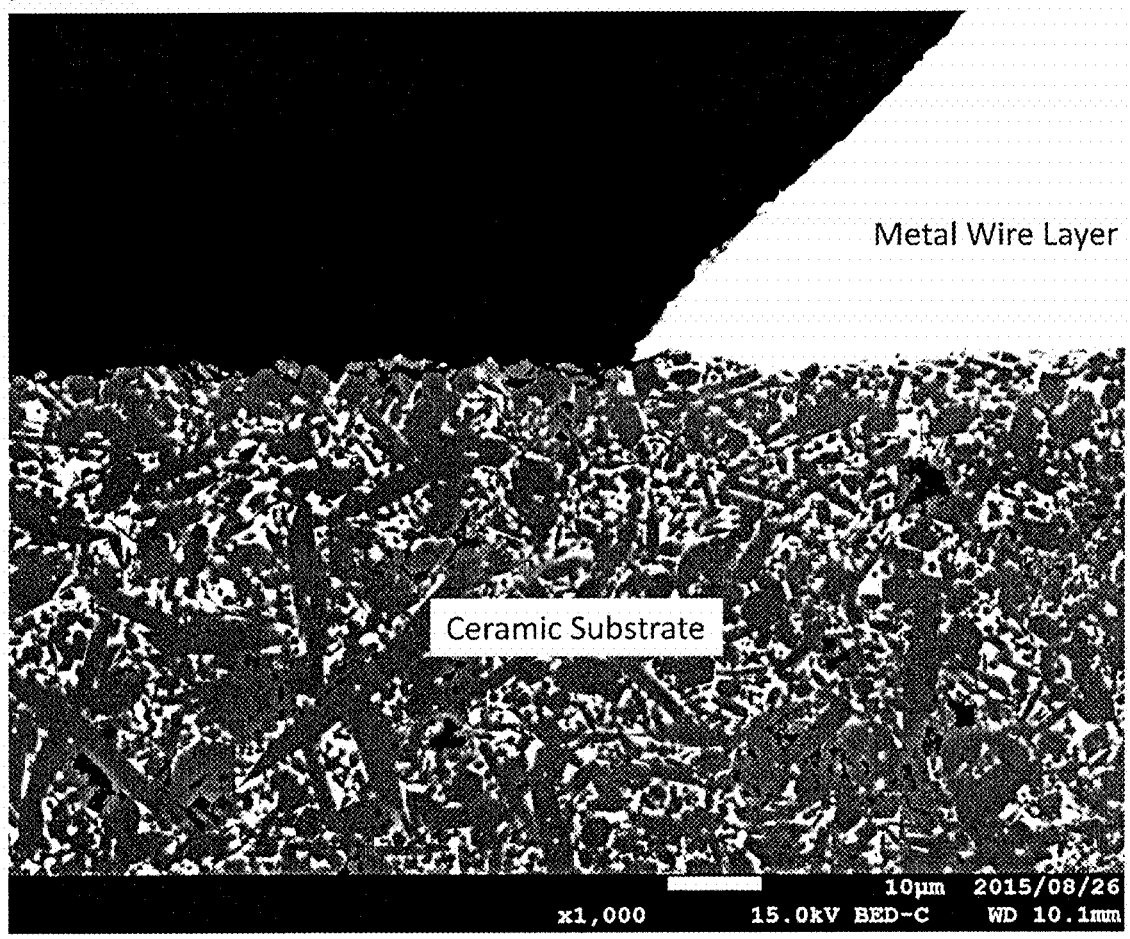

[FIG. 5]
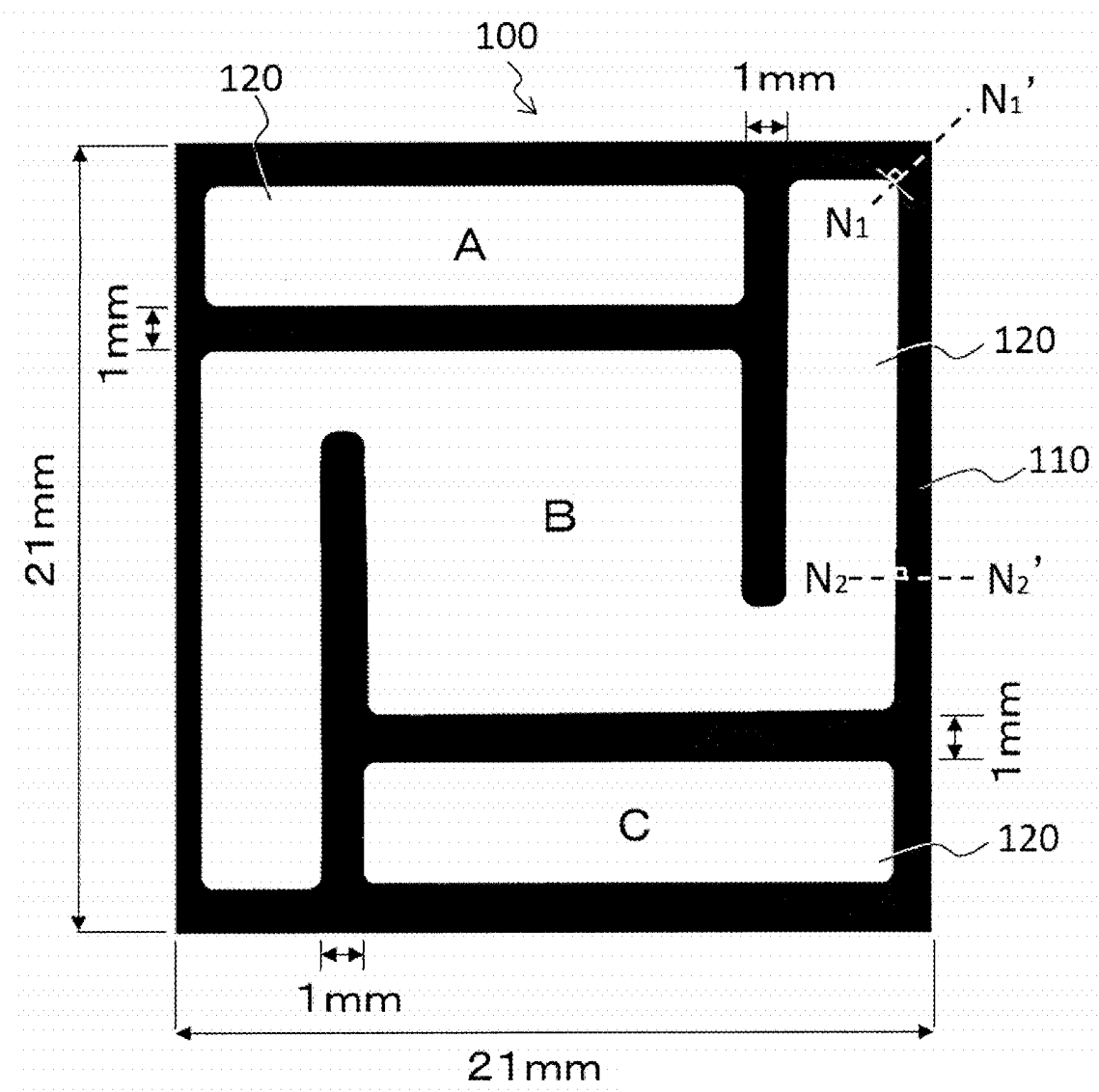

INSULATED HEAT DISSIPATION SUBSTRATE

FIELD OF THE INVENTION

The present disclosure relates to an insulated heat dissipation substrate. More particularly, the present disclosure relates to an insulated heat dissipation substrate on which a power semiconductor is mounted.

BACKGROUND OF THE INVENTION

Power semiconductor modules are used for power control of HEVs/EVs and trains. The power semiconductor modules are formed of a power semiconductor such as, for example, a switching element, an IGBT and a MOSFET; an insulated heat dissipation substrate provided with a conductor layer; a cooling member; and a housing. The power semiconductor module generates high heat because it performs high power control, and it is used under a cooling/heating cycle environment. Therefore, the insulated heat dissipation substrate with the power semiconductor mounted requires bonding strength, electrical insulating properties, and heat dissipating properties, as well as reliability to the cooling/heating cycle (durability).

A DCB (Direct Copper Bond) substrate is widely known as an insulated heat dissipation substrate satisfying such requirements. The DCB substrate is obtained by directly bonding a thin copper plate to a ceramic substrate such as an alumina substrate, an aluminum nitride substrate and a silicon nitride substrate. Also, an AMB (Active Metal Bonding) substrate is widely known as an insulated heat dissipating substrate. The AMB substrate is formed by bonding a ceramic substrate such as an alumina substrate, an aluminum nitride substrate or a silicon nitride substrate to a thin copper plate via a bonding layer formed using a brazing material (a bonding material) containing an active metal. For such insulated heat dissipation substrates, research and development has been continued to achieve further improvement of performance.

For example, Japanese Patent No. 4051164 B (Patent Document 1) discloses that adhesion strength of wired circuit layers such as a metal foil and a metal plate to an insulated substrate can be increased by controlling a surface roughness Rmax and thickness of the substrate between circuit layers, and that even if the surface is subjected to electroless plating, any plating adhesion due to an active solution remaining on the substrate surface can be prevented, and defects due to shorting between the wires can be eliminated, and a circuit board having lower thermal resistance can be obtained.

Japanese Patent No. 4688380 B (Patent Document 2) discloses that the bonding strength between a metal plate and an insulated substrate can be increased by controlling a surface roughness Rmax of the insulated substrate having silicon nitride as a main crystal phase, and a low cost circuit board can be obtained without any trouble even after a plating process.

Japanese Patent No. 5038565 B (Patent Document 3) discloses that anisotropy of a surface roughness of a ceramic substrate forming the circuit board is found to have a significant effect on bending strength, and that by further decreasing the anisotropy of the surface roughness of the ceramic substrate to a predetermined value or less, the bending strength of the ceramic substrate can be improved, and that the use of the ceramic substrate can realize a circuit board having less cracking, high dielectric strength and reliability.

Japanese Patent No. 5498839 B (Patent Document 4) discloses an insulated heat dissipation substrate comprising: an insulated film made of a ceramic material; a bonding layer made of a brazing material; and a circuit board made of a metal. The document discloses that a thickness of the insulated film of 100 µm or less can provide a lower heat transfer resistance due to the insulated film, resulting in good heat conductivity from the circuit board to a heat conductive substrate. Further, it discloses that the bonding strength between the insulated film and the circuit board is improved by providing a plurality of convex portions on the bonding layer side of the insulated film. Furthermore, it also discloses that since each convex portion has a curved surface curved in a convex shape, the generation of cracking in the bonding layer made of the brazing material is suppressed, and the reliability is improved.

CITATION LIST

Patent Literatures

Patent Document 1: Japanese Patent No. 4051164 B
Patent Document 2: Japanese Patent No. 4688380 B
Patent Document 3: Japanese Patent No. 5038565 B
Patent Document 4: Japanese Patent No. 5498839 B

SUMMARY OF THE INVENTION

Technical Problem

Recently, improvement of power density and miniaturization has been required for power semiconductor modules. In response to such requirements, the insulated heat dissipation substrate used for the power semiconductor modules has been studied to increase a thickness of a copper plate for the purpose of achieving both heat dissipating properties and miniaturization. However, when the thicker copper plate is used, a thermal stress generated at a bonding interface between the copper plate and the ceramic substrate is increased due to a thermal expansion difference between the copper and the ceramic, and both of a residual thermal stress generated by a heat treatment when bonding the ceramic substrate with the copper plate and a repeated thermal stress generated by a temperature change during actual use tend to cause a problem that cracking is generated in the ceramic substrate.

In this regard, the prior arts cannot sufficiently prevent cracking under the cooling/heating cycle environment, and there is a need for further improvement of durability. The present disclosure has been made in view of such problems. An object of the present disclosure is to provide an insulated heat dissipation substrate that improves the durability to the cooling/heating cycle and contributes to the miniaturization of the semiconductor module.

Solution to Problem

Cracks in the ceramic substrate, which are generated due to repeated cooling/heating cycles, tend to occur near a bonding end between a conductor layer (which is synonymous with the circuit layer) and a ceramic substrate. The present inventors have pursued its cause, and have revealed by thermal stress analysis that a large thermal stress is applied due to a sharp angle change at the bonding end between the ceramic substrate and the conductor layer. The present inventors have then found that the thermal stress is reduced by smoothing the bonding end, thereby significantly improving the cooling/heating cycle durability. Further, the present inventors have found that a mounting area can be expanded by devising a side surface shape of the conductor layer. The present invention has been completed based on the above findings.

In one aspect, the present disclosure relates to:

An insulated heat dissipation substrate comprising: a ceramic substrate; and a conductor layer bonded onto at least one of main surfaces of the ceramic substrate, wherein the conductor layer comprises: an upper surface; a lower surface; and a side surface 1 connecting the upper surface with the lower surface;

wherein the ceramic substrate comprises: a lowest portion; a side surface 2 connecting the lowest portion with the side surface 1 of the conductor layer; and a bonding surface at a position higher than the lowest portion, the bonding surface being bonded to the lower surface of the conductor layer;

wherein, when the conductor layer and the ceramic substrate are observed in a cross section parallel to both of a normal direction relative to a tangential line of a contour of the conductor layer as viewed in plane and a thickness direction, an absolute value of a difference between an elevation angle α of the side surface 1 at the height of the lower surface relative to the lower surface and an elevation angle β of the side surface 2 at the height of the bonding surface relative to the bonding surface is 20° or less on average; and wherein, when the conductor layer and the ceramic substrate are observed in the cross section parallel to both of the normal direction relative to the tangential line of the contour of the conductor layer as viewed in plane and the thickness direction, the side surface 1 has a receding portion from an end of the upper surface in the normal direction relative to the tangential line of the contour of the conductor layer as viewed in plane.

In one embodiment of the insulated heat dissipation substrate according to the present disclosure, when the conductor layer and the ceramic substrate are observed in the cross section parallel to both of the normal direction relative to the tangential line of the contour of the conductor layer as viewed in plane and the thickness direction, the elevation angle α of the side surface 1 is from 20° to 60° on average.

In another embodiment of the insulated heat dissipation substrate according to the present disclosure, a distance H between the lowest portion of the ceramic substrate and the end portion of the bonding surface in the thickness direction is from 0 µm to 30 µm on average.

In another embodiment of the insulated heat dissipation substrate according to the present disclosure, when the conductor layer and the ceramic substrate are observed in the cross section parallel to both of the normal direction relative to the tangential line of the contour of the conductor layer as viewed in plane and the thickness direction, each of contours of the side surface 1 and the side surface 2 has an inwardly recessed curve line.

In still another embodiment of the insulated heat dissipation substrate according to the present disclosure, when the conductor layer and the ceramic substrate are observed in the cross section parallel to both of the normal direction relative to the tangential line of the contour of the conductor layer as viewed in plane and the thickness direction, a distance L from the lowest portion to the bonding end of the bonding surface in the normal direction relative to the tangential line of the contour of the conductor layer as viewed in plane is from 5 µm to 30 µm on average.

In still another embodiment of the insulated heat dissipation substrate according to the present disclosure, the most receding portion of the receding portion of the side surface 1 recedes 200 µm or less on average from the end portion of the upper surface in the normal direction relative to the tangential line of the contour of the conductor layer as viewed in plane.

In still another embodiment of the insulated heat dissipation substrate according to the present disclosure, the most receding portion of the receding portion of the side surface 1 recedes 20 µm or more and 100 µm or less on average from the end portion of the upper surface in the normal direction relative to the tangential line of the contour of the conductor layer as viewed in plane.

Advantageous Effects

According to the present disclosure, it is possible to improve the durability of the insulated heat dissipation substrate to the cooling/heating cycle, and also to expand the mounting area. Therefore, the present disclosure can be advantageously applied to an insulated heat dissipation substrate in which a thickness of a copper plate is increased in order to achieve both of heat dissipation and miniaturization, and can particularly contribute to improvement of output density and miniaturization of the power semiconductor module.

BRIEF DESCRIPTION OF THE DRAWINGS

FIG. 1 is a schematic view of an insulated heat dissipation substrate according to an embodiment of the present disclosure when partially observing a conductor layer and a ceramic substrate in a cross section parallel to both of a normal direction relative to a tangential line of a contour of the conductor layer as viewed in plane and a thickness direction.

FIG. 2 is a schematic view near a bonding end between a conductor layer and a ceramic substrate of an insulated heat dissipation substrate according to one embodiment of the present disclosure when partially observing a conductor layer and a ceramic substrate in a cross section parallel to both of a normal direction relative to a tangential line of a contour of the conductor layer as viewed in plane and a thickness direction.

FIG. 3 is a SEM image near a bonding end between a conductor layer and a ceramic substrate of an insulated heat dissipation substrate according to one embodiment of the present disclosure when partially observing a conductor layer and a ceramic substrate in a cross section parallel to both of a normal direction relative to a tangential line of a contour of the conductor layer as viewed in plane and a thickness direction.

FIG. 4 is a SEM image near a bonding end between a conductor layer and a ceramic substrate of a conventional insulated heat dissipation substrate when partially observing a conductor layer and a ceramic substrate in a cross section parallel to both of a normal direction relative to a tangential line of a contour of the conductor layer as viewed in plane and a thickness direction.

FIG. 5 is a schematic plan view of an insulated heat dissipation substrate produced in Example.

DETAILED DESCRIPTION OF THE INVENTION

Hereinafter, embodiments of the present disclosure will be specifically described with reference to the drawings.

However, it should be understood that the present disclosure is not limited the following embodiments, and various modifications and improvements of the following embodiments may be made based on the knowledge of a person skilled in the art, without departing from the spirit of the present disclosure.

<1. Insulated Heat Dissipation Substrate>

FIG. 1 shows a schematic view of an insulated heat dissipation substrate 100 according to an embodiment of the present disclosure, when partially observing a conductor layer and a ceramic substrate in a cross section parallel to both of a normal direction relative to a tangential line of a contour of the conductor layer as viewed in plane and a thickness direction. As used herein, the "viewed in plane" refers to a method of observing this insulated heat dissipation substrate from a direction where its projected area is maximized, and the "thickness direction" refers to a direction parallel to the observing direction. The insulated heat dissipation substrate 100 includes: a ceramic substrate 110; and a conductor layer 120 bonded onto at least one of main surfaces of the ceramic substrate 110. The conductor layer 120 may be bonded onto one main surface of the ceramic substrate 110 or the conductor layer 120 may be bonded onto both main surfaces. An example of a plan view of the insulated heat dissipation substrate 100 is shown in FIG. 5. The conductor layer 120 can be formed in any pattern for forming an electrical circuit.

The conductor layer 104 has: an upper surface 121; a lower surface 122; and a side surface 1 (123) connecting the upper surface 121 with the lower surface 122. The ceramic substrate 110 has a lowest portion 111; a side surface 2 (112) connecting the lowest portion 111 with a side surface 1 (121) of the conductor layer 120; and a bonding surface 113 at a position higher than the lowest portion 111 and bonded to the lower surface 122 of the conductor layer 120. As used herein, the lowest portion 111 of the ceramic substrate refers to a portion to which the distance in the thickness direction from an end portion of the bonding surface 113 (a bonding end) is the longest in the surface of the ceramic substrate from the bonding end to a position separated by 50 μm in the normal direction, when the conductor layer 120 and the ceramic substrate 110 are observed by SEM at magnifications of 1000 in the cross section parallel to both of the normal direction relative to the tangential line of the contour of the conductor layer 120 as viewed in plane and the thickness direction. When a plurality of portions with the longest distance from the bonding end in the thickness direction are present or that portion is continuous, the portion where the distance from the bonding end in the normal direction is the shortest is determined to be the lowest portion. Examples of the normal line relative to the tangential line of the contour of the conductor layer 120 as viewed in plane are shown by the dotted line $N_1$-$N_1$' and the dotted line $N_2$-$N_2$' in FIG. 5.

The insulated heat dissipation substrate 100 can be used as a substrate on which a power semiconductor (not shown) is mounted, in a power semiconductor module including the power semiconductor such as, for example, a switching element, an IGBT, and a MOSFET. The conductor layer 120 can form an electric circuit pattern, and the power semiconductor can be mounted on the electric circuit pattern.

Examples of the ceramic substrate 110 include nitride ceramic substrates such as a silicon nitride ($Si_3N_4$) substrate and an aluminum nitride (AlN) substrate, as well as an alumina ($Al_2O_3$) substrate. In order to realize the present disclosure, the planar shape and size of the ceramic substrate 110 are not particularly limited. However, from the viewpoint of downsizing of the power semiconductor module, examples thereof include a ceramic substrate having a rectangular shape as viewed in plane, which has one side of from about 20 mm to 70 mm and a thickness of from 0.1 mm to 1.0 mm.

The conductor layer 120 can be formed of a metal such as copper (Cu), a copper alloy, aluminum (Al), or an aluminum alloy. The conductor layer 120 can also be formed of a high melting point metal such as tungsten (W) and molybdenum (Mo) or of a metallized layer of silver (Ag). In addition, nickel, iron, titanium and molybdenum can also be used. A thickness of the conductor layer 120 (an average of differences in height between the upper surface 121 and the lower surface 122 of the conductor layer 120 (a distance in the thickness direction)) is preferably from 0.3 mm to 2.0 mm, and more preferably from 0.5 mm to 1.5 mm, in terms of miniaturizing the power semiconductor module.

In the embodiment shown in FIG. 1, when the conductor layer 120 and the ceramic substrate 110 are observed in the cross section parallel to both of the normal direction relative to the tangential line of the contour of the conductor layer 120 as viewed in plane and the thickness direction, the side surface 1 (123) has a receding portion from the end of the upper surface 121 in the normal direction relative to the tangential line of the contour of the conductor layer 120 as viewed in plane. In other words, the side surface 1 (123) is configured such that the upper surface 121 protrudes. It is understood that this can allow enlargement of the bonding area where the semiconductor chip can be mounted, as well as mounting areas such as a mounting area for mounting the semiconductor chip by soldering or the like and areas for connection (e.g., ultrasonic connection) of terminals. Therefore, according to the present disclosure, if amounts of the semiconductor chips mounted are the same, the area of the insulated heat dissipation substrate can be decreased, in other words, the semiconductor module can be miniaturized.

From the viewpoint of increasing the mounting areas, the most receding portion of the receding portion on the side surface 1 (123) preferably recedes 10 μm or more, more preferably 20 μm or more, and even more preferably by 40 μm or more on average from the end portion of the upper surface 121 in the normal direction relative to the tangential line of the contour of the conductor layer 120 as viewed in plane. However, if the side surface 1 (123) recedes too much, the tip of the upper surface 121 becomes sharp so that the strength is likely to be decreased, and further the tip is likely to be in a drooping state. Such a portion is unsuitable as a mounting area. Therefore, the most receding portion of the receding portion of the side surface 1 preferably recedes 200 μm or less, more preferably by 150 μm or less, and even more preferably by 100 μm or less on average from the end of the upper surface in the normal direction relative to the tangential line of the contour of the conductor layer as viewed in plane.

FIG. 2 shows a schematic view near the bonding end between the conductor layer 120 and the ceramic substrate 110 of the insulated heat dissipation substrate according to one embodiment of the present disclosure when partially observing the conductor layer 120 and the ceramic substrate 110 in the cross section parallel to both of the normal direction relative to the tangential line of the contour of the conductor layer 120 as viewed in plane and the thickness direction. In the cross-sectional observation, it is important to decrease an absolute value of a difference between an elevation angle α of the side surface 1 (123) at the height of the lower surface 122 relative to the lower surface 122 and an elevation angle β of the side surface 2 (112) at the height of the bonding surface (113) relative to the bonding surface 113 in order to improve the cooling/heating cycle durability.

In the conventional insulated heat dissipation substrate, the bonding end between the ceramic substrate and the conductor layer has a pin angle (a sharp edge at the tip) as shown in FIG. 4, so that a sharp angle change is present. Such a pin angle is subject to a larger thermal stress. This means that if there is the pin angle near the bonding end between the conductor layer and the ceramic substrate, cracking will easily occur starting from the pin angle due to repeated cooling/heating cycles.

Therefore, the present inventors have hypothesized that the cracking can be suppressed by the absence of the pin angle near the bonding end between the conductor layer and the ceramic substrate, and have conducted various experiments and studies. As a result, the present inventors have found that when the absolute value ($|\alpha-\beta|$) of the difference between the elevation angle $\alpha$ ($0° \leq \alpha \leq 90°$) of the side surface 1 (123) at the height of the lower surface 122 relative to the lower surface 122 and the elevation angle $\beta$ ($0° \leq \beta \leq 90°$) of the side surface 2 (112) at the height of the bonding surface (113) relative to the bonding surface (113) is 20° or less on average, the cooling/heating cycle durability is significantly improved. The average of $|\alpha-\beta|$ is preferably 8° or less, and more preferably 5° or less, for example from 1° to 20°. The average value is determined by arbitrary five or more cross-sectional observations of the insulated heat dissipation substrate to be measured (the same is true for average values of the following parameters).

The elevation angle $\alpha$ itself of the side surface 1 (123) is not particularly limited. However, an elevation angle of less than 20° or more than 60° complicates selection of etching conditions for forming the shape and wet blast conditions, so the $\alpha$ is generally from 20° to 60°, and preferably from 20° to 30°.

FIG. 3 is a SEM image near the bonding end between the conductor layer and the ceramic substrate of the insulated heat dissipation substrate according to one embodiment of the present disclosure when partially observing the conductor layer and the ceramic substrate in the cross section parallel to both of the normal direction relative to the tangential line of the contour of the conductor layer as viewed in plane and the thickness direction. As can be seen, the bonding end between the ceramic substrate and the conductor layer has smooth connection.

Referring to FIG. 2 again, in addition to the portion of the bonding interface, the side surface 2 (112) becomes less susceptible to thermal stress if the entire side surface 2 has no drastic angle change, which leads to improvement of the cooling/heating cycle durability. From this point of view, when the conductor layer 120 and the ceramic substrate 110 are observed in the cross section parallel to both of the normal direction relative to the tangential line of the contour of the conductor layer 120 as viewed in plane and the thickness direction, an absolute value ($|\beta-\gamma|$) of a difference between an elevation angle $\beta$ of the side surface 2 (112) and an elevation angle $\gamma$ of the side surface 2 (112) relative to the bonding surface 113 at a point separated by 10 μm from the bonding end of the bonding surface 113 in the normal direction relative to the tangential line of the contour of the conductor layer 120 as viewed in plane is preferably smaller. Specifically, the $|\beta-\gamma|$ is preferably 30° or less on average. On the other hand, if the $|\beta-\gamma|$ is too small, the ceramic substrate 110 is largely cut and the thickness is decreased, resulting in deteriorated insulation performance. Therefore, the $|\beta-\gamma|$ is preferably 5° or more on average. However, a characteristic difference caused by the change of $|\beta-\gamma|$ is minor.

From the viewpoint of preventing the ceramic substrate from being largely cut resulting in deterioration of the insulation performance, when the conductor layer 120 and the ceramic substrate 110 are observed in the cross section parallel to both of the normal direction relative to the tangential line of the contour of the conductor layer 120 as viewed in plane and the thickness direction, a distance H between the lowest portion 111 of the ceramic substrate 110 and the end portion (bonding end) of the bonding surface 113 in the thickness direction is preferably 30 μm or less, and more preferably 20 μm or less, and even more preferably 10 μm or less on average. The lower limit of the H is not particularly set, and it may be zero. However, a larger value of the H tends to decrease the $|\alpha-\beta|$. Therefore, the H is preferably 2 μm or more on average.

From the viewpoint of preventing the ceramic substrate from being largely cut resulting in deterioration of the insulation performance, when the conductor layer 120 and the ceramic substrate 110 are observed in the cross section parallel to both of the normal direction relative to the tangential line of the contour of the conductor layer 120 as viewed in plane and the thickness direction, a distance L from the lowest portion 111 to the bonding end of the bonding surface 113 in the normal direction relative to the tangential line of the contour of the conductor 120 as viewed in plane is preferably 5 μm or more, and more preferably 10 μm or more on average. However, if the distance L is too long, it is necessary to increase a distance (a space) between the conductors and an effect of suppressing a deterioration of the insulation performance is saturated. Therefore, the distance L is preferably 30 μm or less, and more preferably 20 μm or less on average.

In the present invention, the elevation angles $\alpha$ and $\beta$ are measured in the following procedures by observing the above cross section with SEM at magnifications of 1000. An approximate straight line A having a length of 30 μm corresponding to the contour shape of the side surface 1 (123) is drawn from the bonding end between the conductor layer 120 and the ceramic substrate 110. An approximate straight line B corresponding to the contour shape of the side surface 2 (112) is drawn from the bonding end between the conductor layer 120 and the ceramic substrate 110. The straight line B is half the length of H between the lowest portion 111 and the bonding end in the thickness direction. An approximate straight line C having a length of 30 μm corresponding to the contour shape of the bonding surface 113 (lower surface 122) is drawn from the bonding end between the conductor layer 120 and the ceramic substrate 110. The elevation angle $\alpha$ is determined from an angle formed by the approximate straight line A and the approximate straight line C, and the elevation angle $\beta$ is determined from an angle formed by the approximate straight line B and the approximate straight line C.

For example, the SEM image of FIG. 3 shows an image of the approximate straight line A having a length of 30 μm corresponding to the contour shape of the side surface 1 (123) from the bonding end between the conductor layer 120 and the ceramic substrate 110. When 30 or more of contour points on the side surface 1 are evenly plotted on an orthogonal coordinate system ((x, y) coordinates) in a range where the length of the approximate straight line is 30 μm from the bonding end, an approximation formula in the form of y=ax+b is obtained by the least squares method. A straight line corresponding to the approximation formula is the approximate straight line A. In this case, a slope of the approximate straight line A can be uniquely determined. The slopes of the approximate straight line B and the approximate straight line C can be determined in the same manner. The elevation angle α and the elevation angle β can be determined from these slopes.

In the present disclosure, the elevation angle γ is measured according to the following procedures by observing the above cross section by SEM at magnifications of 1000. An approximate straight line D having a length of 5 μm corresponding to the contour shape of the side surface 2 (112) at a point separated by 10 μm from the bonding end between the conductor layer 120 and the ceramic substrate 110 in the normal direction relative to the tangential line of the contour of the conductor 120 as viewed in plane is drawn upwardly (in a direction approaching the bonding end in the thickness direction) from the point. The elevation angle γ is determined from an angle formed by the approximate straight line D and the approximate straight line C.

<2. Production Method>

The insulated heat dissipation substrate according to the present disclosure can be produced by bonding a ceramic substrate with a metal plate or metal foil to produce a bonded substrate, and then forming an electric circuit pattern using a lithography technique and an etching technique, and further carrying out a smoothing process.

The bonding of the ceramic substrate with the metal plate or metal foil to produce the bonded substrate can be carried out by any known technique, including, typically, a method of directly bonding the ceramic substrate to the metal plate or metal foil to produce a DCB substrate, and a method of bonding the ceramic substrate to the metal plate or metal foil via a bonding layer formed using a brazing material (a bonding material) containing an active metal to produce an AMB substrate. Among these, the method of heating and pressing (hot-pressing) them using a brazing material containing Ag and Ti is preferable, in terms of enhancing the bonding strength. Since the brazing material is a conductor, the bonding layer is also regarded as a part of the conductor layer in the present disclosure.

In the case of hot pressing using the brazing material, a bonding atmosphere should be a vacuum or an inert atmosphere (Ar atmosphere or the like), because the bonding is not possible when Ti as the active metal is oxidized. From the viewpoint of increasing the bonding strength, a bonding pressure is preferably 5 MPa or more. However, if the bonding pressure is too high, the ceramic substrate may be broken during bonding, so the bonding pressure is preferably 25 MPa or less. A bonding temperature may be appropriately adjusted according to types of brazing materials used. When using a brazing material containing Ag and Ti, the bonding temperature is preferably from about 800° C. to 1000° C.

In addition, the brazing material that can be used may also include those in which one or more of Cu, Sn, In and the like are added to Ag for lowering the melting point, or those in which Ti is added to their alloy powder. Examples of the Ag—Cu—Ti based brazing material include those containing Ag, Cu, and Ti in a composition weight ratio of from 30 to 70%, from 0 to 40%, and from 0.1 to 20%, respectively. It is also possible to use commercially available products that satisfy these composition ranges.

The lithography technique and the etching technique after producing the bonded substrate may be carried out by any well-known method. A particularly suitable etching method may be wet etching. The elevation angle α of the side surface 1 of the conductor layer is significantly affected by the etching conditions. Therefore, the etching conditions should be noted. In general, the elevation angle α tends to increase as the etching time increases.

It is important to carry out a smoothing process after forming the electric circuit pattern to smooth the bonding end between the conductor layer and the ceramic substrate and the periphery of the bonding end. Examples of the smoothing process include wet blasting, dry blasting, cutting, laser processing, and other machining. Among them, the wet blasting is preferable because it easily creates a smoothly curved surface that is gradually close to a reference surface (plane) of the ceramic substrate from the bonding surface of the ceramic substrate with the metal layer, and such a curved surface can prevent stress concentration. When employing the wet blasting, the state after the smoothing process varies depending on injection pressures and injection times, types and particle sizes of abrasive materials used for the wet blasting. Therefore, appropriate conditions are desirably selected as needed. In general, the elevation angle β of the ceramic substrate tends to increase as the injection time increases. In order to decrease the value of $|α-β|$, the fine abrasive grains should be used and the injection time should be adjusted according to the shape of the side surface 1 of the conductor layer.

Preferable conditions for the wet blasting can be an injection pressure of from 0.01 to 0.5 MPa, an abrasive type of abrasive grain ceramics (SiC, alumina, zirconia, and the like), and a grain diameter of the abrasive of from approximately 1 to 100 μm.

The insulated heat dissipation substrate produced by carrying out the wet blasting smoothing process can typically have one or more, more typically two or more of morphological features as shown below. All of the following features are advantageous in that they lead to cost reduction of wet etching, improvement of productivity, and improvement of controllability of the angle α.

(1) The end portion 124 of the upper surface of the conductor layer 120 recedes from the end portion 125 of the lower surface of the conductor layer 120 in the normal direction relative to the tangential line of the contour of the conductor layer 120 as viewed in plane (see FIG. 1).

(2) When the conductor layer 120 and the ceramic substrate 110 are observed in the cross section parallel to both of the normal direction relative to the tangential line of the contour of the conductor layer 120 as viewed in plane and the thickness direction, each of the side surface 1 (123) and the side surface 2 (112) has an inwardly recessed curve line (see FIG. 1).

(3) When the conductor layer 120 and the ceramic substrate 110 are observed in the cross section parallel to both of the normal direction relative to the tangential line of the contour of the conductor layer 120 as viewed in plane and the thickness direction, the side surface 1 (123) has a portion that recedes from the end portion 124 of the upper surface of the conductor layer 120 in the normal direction relative to the tangential line of the contour of the conductor layer 120 as viewed in plane (see FIG. 1).

After the smoothing process, various surface treatments can be further carried out. Examples of the surface treatments include, but not limited to, an acid treatment, an alkali treatment, washing, plating, a rust prevention treatment and the like.

EXAMPLES

Hereinafter, the present disclosure will be more specifically described by way of examples, but the present disclosure is not limited by these examples.

(1. Production of Insulated Heat Dissipation Substrate)

As a ceramic substrate, a silicon nitride ($Si_3N_4$) substrate having a thickness of 0.3 mm and a rectangular shape (21 mm width×21 mm length) as viewed in plane was prepared. A copper (Cu) plate having a thickness of 0.5 mm and a rectangular shape (21 mm width×21 mm length) as viewed in plane was bonded to one side of the silicon nitride substrate by hot pressing using a brazing material to obtain a bonded substrate of the ceramic substrate and the copper plate. As the brazing material, a material having a composition weight ratio of Ag: 51% by mass, Cu: 24% by mass, In: 11% by mass, and Ti: 14% by mass was used. The hot pressing was carried out under a bonding pressure of 20 MPa under vacuum at 850° C.

From the bonded substrate obtained by the above procedure, a conductor pattern as shown in FIG. 5 was formed through pattern formation with photolithography and wet etching. As an etching solution, an aqueous solution (pH=1 to 3) containing cupric chloride and ferric chloride was used. The wet etching was carried out under two conditions (Cu etching condition 1 and Cu etching condition 2) having different etching time according to the test number. The etching time was adjusted so that under Cu etching condition 1, a target value of the angle α of the side surface 1 of the conductor layer was 50°, and under Cu etching condition 2, a target value of the angle α of the side surface 1 of the conductor layer was 25°. Specifically, under Cu etching condition 1, the etching time was 1 hour, and under Cu etching condition 2, the etching time was 0.5 hour.

After forming the conductor pattern, wet blasting was carried out on the conductor pattern-formed surface of the bonded substrate in order to smooth the vicinity of the bonding end between the conductor layer and the ceramic substrate. The wet blasting was carried out by spraying a slurry of an abrasive (SiC particles having a particle size of from about 10 to 20 μm) in water in a direction perpendicular to the conductor pattern-formed surface, using a wet blasting device. In this case, an injection pressure was 0.15 MPa, a moving speed of a nozzle was 100 mm/sec, and the number of passes was varied to change the shape of the side surface 2 of the ceramic substrate. With one pass, the slit-shaped nozzle moves from one side of the bonded substrate to the side opposite thereto, whereby the entire surface is wet-blasted once. The number of passes refers to a repeated number of that operation.

(2. Evaluation of Shape)

For the insulated heat dissipation substrate of each Test Example obtained through the above steps, the conductor layer and the ceramic substrate were cut such that the cross section parallel to both of the normal direction relative to the tangential line of the contour of the conductor layer as viewed in plane and the thickness direction was exposed, and embedded in a resin. The exposed cross section was then polished, observed by SEM at magnifications of 1000 and evaluated as follows. The results are shown in Table 1.

(1) Evaluation 1

Evaluation was performed for whether or not the end portion of the upper surface of the conductor layer receded from the end portion of the lower surface of the conductor layer in the normal direction relative to the tangential line of contour of the conductor layer as viewed in plane. The evaluation was performed for arbitrary five cross sections, and a case where all the five cross sections satisfied the above conditions was determined to be "YES", and all other cases were determined to be "NO".

(2) Evaluation 2

Evaluation was performed for whether or not the contour of each of the side surface 1 and the side surface 2 of the conductor layer had an inwardly recessed curve line. The evaluation was performed for arbitrary five cross sections, and a case where all the five cross sections satisfied the above conditions was determined to be "YES", and all other cases were determined to be "NO".

(3) Evaluation 3

Evaluation was performed for whether or not the side surface 1 had a portion receding from the end portion of the upper surface of the conductor layer in the normal direction relative to the tangential line of the contour of the conductor layer as viewed in plane. The evaluation was performed for arbitrary five cross sections, and a case where all the five cross sections satisfied the above conditions was determined to be "YES", and all other cases were determined to be "NO". Also, in the case of YES, an average of the distances to the most receding portion of the receding portion of the side surface 1 from the end portion of the upper surface of the conductor layer in the normal direction relative to the tangential line of the contour of the conductor layer as viewed in plane was calculated from the five cross sections.

(4) Evaluation 4

The elevation angle α, elevation angle β, elevation angle γ, α–β, and β–γ were measured for arbitrary five cross sections, and each average value was determined.

(5) Evaluation 5

The distance H between the lowest portion of the ceramic substrate and the bonding end in the thickness direction was measured for arbitrary five cross sections, and an average value was determined.

(6) Evaluation 6

The distance L from the lowest portion of the ceramic substrate to the bonding end of the bonding surface of the ceramic substrate in the normal direction relative to the tangential line of the contour of the conductor layer as viewed in plane was measured for arbitrary five cross sections, and an average value was determined.

(3. Cooling/Heating Cycle Test)

A cooling/heating cycle test was conducted on the insulated heat dissipation substrate of each of Test Examples obtained through the above steps. The cooling/heating cycle test was conducted where a cooling/heating cycle of –55° C. (15 minutes)/175° C. (15 minutes) was repeated 1000 cyc (cycles). Every 100 cyc in the course of the process (that is, total 10 times), the presence or absence of peeling off of the bonded portion and cracks in the ceramic substrate (hereinafter collectively referred to as "defect") was confirmed by appearance check with a stereoscopic microscope and ultrasonic inspection, and the cycle number in which the cooling/heating cycle test could be carried out without defect was evaluated.

The results are shown in Table 3. For example, "100" indicates that the defect did not occur until the first 100 cyc, but the defect occurred during observation at the end of 200 cyc. Further, "1000" indicates that no defect occurred before conducting 1000 cyc.

(4. Dielectric Breakdown Voltage)

The dielectric breakdown voltage was measured on the insulated heat dissipation substrate of each of Test Examples obtained through the above steps. The measurement was carried out by applying an alternating voltage (an effective value of 6 kV, a frequency of 60 Hz) for 10 seconds between the upper surface of the largest conductor layer in the center among the three conductor layers as shown in FIG. 5 and the non-bonded surface of the ceramic substrate (a surface opposite to the surface to which the conductor layers were bonded) in an insulated oil. A case where no short occurred was evaluated as "OK", and a case where short occurred was evaluated as "NG". The results are shown in Table 1.

TABLE 1

| Test Nos. | Wet Blasting Number of Passes | Evaluation 1 | Evaluation 2 | Evaluation 3 Receding Portion | Most Receding Distance (μm) | Evaluation 4 α | β | γ | α−β | β−γ | Evaluation 5 H (μm) | Evaluation 6 L (μm) | Cooling/Heating Cycle Durability −55° C.⇔175° C. | Dielectric Breakdown Voltage AC6kV_ 10 sec |
|---|---|---|---|---|---|---|---|---|---|---|---|---|---|---|
| (Cu Etching Condition 1: α Target Value 50°) |
| Comparative Example 1-1 | 0 | Yes | Yes | Yes | 231 | 49.8° | 0° | 0° | 49.8° | 0.0° | 0 | 0 | 100 | OK |
| Example 1-1 | 150 | Yes | Yes | Yes | 117 | 50.1° | 31.3° | 3.2° | 18.8° | 28.1° | 3 | 5 | 100 | OK |
| Example 1-2 | 400 | Yes | Yes | Yes | 35 | 48.8° | 39.3° | 26.1° | 9.5° | 13.2° | 12 | 14 | 1000 | OK |
| Example 1-3 | 600 | Yes | Yes | Yes | 44 | 52.4° | 45.2° | 31.2° | 7.2° | 14.0° | 20 | 18 | 1000 | OK |
| Example 1-4 | 600 | Yes | Yes | Yes | 81 | 52.5° | 50.6° | 41.9° | 1.9° | 8.7° | 16 | 15 | 100 | OK |
| Example 1-5 | 1000 | Yes | Yes | Yes | 72 | 51.3° | 49.8° | 40.5° | 1.5° | 9.3° | 35 | 43 | 1000 | NG |
| Example 1-6 | 700 | Yes | Yes | Yes | 92 | 53.° | 48.5° | 43.6° | 4.5° | 4.9° | 18 | 15 | 1000 | OK |
| Example 1-7 | 700 | Yes | Yes | Yes | 81 | 47.5° | 45.4° | 40.1° | 2.1° | 5.3° | 21 | 22 | 1000 | OK |
| (Cu Etching Condition 2: α Target Value 25°) |
| Comparative Example 2-1 | 0 | Yes | Yes | Yes | 210 | 25.1° | 0° | 0° | 25.1° | 0° | 0 | 0 | 300 | OK |
| Example 2-1 | 100 | Yes | Yes | Yes | 131 | 24.8° | 5.2° | 0° | 19.6° | 5° | 2 | 2 | 1000 | OK |
| Example 2-2 | 100 | Yes | Yes | Yes | 92 | 23.2° | 14.3° | 0° | 8.9° | 14° | 3 | 4 | 1000 | OK |
| Example 2-3 | 150 | Yes | Yes | Yes | 81 | 23.8° | 17.1° | 3.6° | 6.7° | 14° | 5 | 6 | 1000 | OK |
| Example 2-4 | 200 | Yes | Yes | Yes | 76 | 24.5° | 20.4° | 17.1° | 4.1° | 3° | 8 | 16 | 1000 | OK |
| Example 2-5 | 200 | Yes | Yes | Yes | 55 | 27.1° | 28.2° | 23.8° | −1.1° | 4° | 10 | 16 | 1000 | OK |

(5. Discussion)

It is understood from the above results that Examples 1-1 through 1-7 and Examples 2-1 through 2-5 where each average absolute value of α−β was 20° or less resulted in significantly improved cooling/heating cycle durability, as compared with Comparative Example 1-1 and Comparative Example 2-1 where each average absolute values of α−β was more than 20°. In addition, a large grinding amount as in Example 1-5 would lead to a decreased thickness of the substrate, which would affect the dielectric breakdown characteristics.

DESCRIPTION OF REFERENCE NUMERALS

100 insulated heat dissipation substrate
110 ceramic substrate
111 lowest portion of ceramic substrate
112 side surface 2 of ceramic substrate
113 bonding surface of ceramic substrate
120 conductor layer
121 upper surface of conductor layer
122 lower surface of conductor layer
123 side surface 1 of conductor layer
124 end portion of upper surface of conductor layer
125 end portion of lower surface of conductor layer

What is claimed is:

1. An insulated heat dissipation substrate comprising: a ceramic substrate; and a conductor layer bonded onto at least one of main surfaces of the ceramic substrate,
   wherein the conductor layer comprises: an upper surface; a lower surface; and a side surface 1 connecting the upper surface with the lower surface;
   wherein the ceramic substrate comprises: a lowest portion; a side surface 2 connecting the lowest portion with the side surface 1 of the conductor layer; and a bonding surface at a position higher than the lowest portion, the bonding surface being bonded to the lower surface of the conductor layer;
   wherein, when the conductor layer and the ceramic substrate are observed in a cross section parallel to both of a normal direction relative to a tangential line of a contour of the conductor layer as viewed in plane and a thickness direction, an absolute value of a difference between an elevation angle α of the side surface 1 at the height of the lower surface relative to the lower surface and an elevation angle β of the side surface 2 at the height of the bonding surface relative to the bonding surface is 20° or less on average; and
   wherein, when the conductor layer and the ceramic substrate are observed in the cross section parallel to both of the normal direction relative to the tangential line of the contour of the conductor layer as viewed in plane and the thickness direction, the side surface 1 has a receding portion from an end of the upper surface in the normal direction relative to the tangential line of the contour of the conductor layer as viewed in plane.

2. The insulated heat dissipation substrate according to claim 1, wherein, when the conductor layer and the ceramic substrate are observed in the cross section parallel to both of the normal direction relative to the tangential line of the contour of the conductor layer as viewed in plane and the thickness direction, the elevation angle α of the side surface 1 is from 20° to 60° on average.

3. The insulated heat dissipation substrate according to claim 1, wherein a distance H between the lowest portion of the ceramic substrate and the end portion of the bonding surface in the thickness direction is from 0 μm to 30 μm on average.

4. The insulated heat dissipation substrate according to claim 1, wherein, when the conductor layer and the ceramic substrate are observed in the cross section parallel to both of the normal direction relative to the tangential line of the contour of the conductor layer as viewed in plane and the thickness direction, each of contours of the side surface 1 and the side surface 2 has an inwardly recessed curve line.

5. The insulated heat dissipation substrate according to claim 1, wherein, when the conductor layer and the ceramic substrate are observed in the cross section parallel to both of the normal direction relative to the tangential line of the contour of the conductor layer as viewed in plane and the thickness direction, a distance L from the lowest portion to the bonding end of the bonding surface in the normal direction relative to the tangential line of the contour of the conductor layer as viewed in plane is from 5 μm to 30 μm on average.

6. The insulated heat dissipation substrate according to claim 1, wherein the most receding portion of the receding portion of the side surface 1 recedes 200 μm or less on average from the end portion of the upper surface in the normal direction relative to the tangential line of the contour of the conductor layer as viewed in plane.

7. The insulated heat dissipation substrate according to claim 6, wherein the most receding portion of the receding portion of the side surface 1 recedes 20 μm or more and 100 μm or less on average from the end portion of the upper surface in the normal direction relative to the tangential line of the contour of the conductor layer as viewed in plane.

* * * * *